(12) United States Patent
Muramatsu et al.

(10) Patent No.: US 7,438,945 B2
(45) Date of Patent: Oct. 21, 2008

(54) METHOD OF PRODUCING MULTILAYER INTERCONNECTION BOARD

(75) Inventors: Shigetsugu Muramatsu, Nagano (JP); Katsumi Yamazaki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 726 days.

(21) Appl. No.: 11/033,340

(22) Filed: Jan. 11, 2005

(65) Prior Publication Data

US 2005/0158455 A1    Jul. 21, 2005

(30) Foreign Application Priority Data

Jan. 16, 2004   (JP)   ............... 2004-008796

(51) Int. Cl.
*B05D 5/12* (2006.01)
*B05D 3/00* (2006.01)

(52) U.S. Cl. ............ 427/97.7; 427/97.1; 427/97.2; 427/271; 427/272; 427/282; 427/355; 427/369

(58) Field of Classification Search .......... 427/97.1, 427/97.2, 97.7, 258, 271, 272, 282, 355, 427/369

See application file for complete search history.

(56) References Cited

U.S. PATENT DOCUMENTS 6,869,557 B1 * 3/2005 Wago et al. ............... 264/293
2003/0112576 A1 * 6/2003 Brewer et al. ............ 361/119

FOREIGN PATENT DOCUMENTS

JP    10-117058    5/1998

\* cited by examiner

*Primary Examiner*—Brian K Talbot
(74) *Attorney, Agent, or Firm*—Ladas & Parry LLP

(57) ABSTRACT

A method of producing a multilayer interconnection board is disclosed that includes the steps of processing a resin member on an interconnection layer by imprinting press, and removing residue of the resin member at the bottom of a via hole after forming the via hole. In the method of producing a multilayer interconnection board, a thermal setting resin, which has a setting temperature higher than that of the resin member, is applied on a via-connecting portion of the interconnection layer, the resin member is formed on the interconnection layer, an interconnection groove and a via hole are formed by imprinting press on the resin member by using a tool, and an un-cured portion of the high temperature setting resin is dissolved and removed by using a resin solvent. Thereby, residue of the resin member on the thermal setting resin is removed.

5 Claims, 10 Drawing Sheets

METHOD OF PRODUCING MULTILAYER INTERCONNECTION BOARD

BACKGROUND OF THE INVENTION

1. Field of the Invention

The present invention relates to a method of producing a multilayer interconnection board, and particularly, to a method of producing a multilayer interconnection board including the steps of processing a resin member on an interconnection by imprinting press, and removing residue of the resin member at the bottom of a via hole after forming the via hole.

2. Description of the Related Art

Along with requirements of enhanced performance and decreased size of recent electronic communication apparatuses, development has been made in the field of printed circuit boards, specifically, a multilayer interconnection board on which plural layers of interconnection circuits are stacked to increase density of the circuits. For example, there is a kind of multilayer interconnection board produced by a so-called "built-up method", in which interconnection layers and insulating layers are stacked alternately, and vias are provided between an upper interconnection layer and a lower interconnection layer for connecting the two interconnection layers.

A via is formed by filling a hole (a via hole) opened in an insulating layer with metal for the purpose of connection between conductive materials separated by the insulating layer. Usually, the via hole can be formed by a laser (the so-called laser processing), or can be formed by using a tool (the so-called imprinting press). With the imprinting press using a tool, because via holes and interconnection grooves can be formed in the same layer at the same time, and fabrication cost is low because it is not necessary to use expensive laser processing apparatuses, so that this method has attracted attention recently.

Below, descriptions are made of a process of forming a multilayer interconnection board by imprinting press using a tool in the related art with reference to FIG. 1 through FIG. 5.

FIG. 1 is a schematic cross-sectional view showing a step of a process of forming a multilayer interconnection board in the related art.

As illustrated in FIG. 1, an interconnection 12 and resin 13 are formed on a substrate 11 sequentially.

FIG. 2 is a schematic cross-sectional view showing a step of the process of forming the multilayer interconnection board in the related art.

As illustrated in FIG. 2, a tool 15 having a projecting portion 16 for forming a via hole is pressed against the resin 13 to perform imprinting press.

FIG. 3 is a schematic cross-sectional view showing a step of the process of forming the multilayer interconnection board in the related art.

As illustrated in FIG. 3, the tool 15 is removed after the resin 13 cures, and thereby, the via hole 18 is formed.

Because the resin 13 exists between the projecting portion 16 and the interconnection 12, a resin layer 17 remains at the bottom of the via hole 18. Further, in FIG. 3, a reference number 19A indicates a side wall of the via hole 18.

With the residual resin layer 17 being present, even when the via hole is filled with metal and a via is formed, because the resin layer 17 is insulating, the via and the interconnection 12 are not electrically connected.

FIG. 4 is a schematic cross-sectional view showing a step of removing the residual resin layer 17 in the process of forming the multilayer interconnection board in the related art.

Because the via and the interconnection 12 cannot be electrically connected due to existence of the residual resin layer 17, as a solution to this problem, in the related art, as illustrated in FIG. 4, a step is carried out of removing the residue of the resin layer 17 on the interconnection 12 after imprinting press with the tool 15.

In FIG. 4, a letter "A" indicates the position of the via hole 18 after imprinting press with the tool 15, a reference number 19B indicates a side wall of the via hole (represented by a reference number 20) after the resin layer 17 is removed. When removing the resin layer 17, a resin solvent is used, and by this removing step, the interconnection 12 is exposed through the via hole 20.

FIG. 5 is a schematic cross-sectional view showing a step in the process of forming the multilayer interconnection board in the related art.

Following the step in FIG. 4, the via hole 20 is filled with metal and a via 21 is formed on the interconnection 12, thus, the via 21 and the interconnection 12 are electrically connected.

If forming the via hole by a laser, there is still resin remaining on the interconnection, although it is not so much compared with the above imprinting press using a tool. Therefore, similarly, the step of removing the residual resin is performed by using the resin solvent. This is described in Japanese Laid Open Patent Application No. 10-117058.

However, when removing the resin layer 17 by using the resin solvent, as illustrated in FIG. 4, the resin 13, which constitutes the via hole 18, is also dissolved, hence, the side wall 19A of the via hole 18 broadens in the crosswise direction, and the side wall moves to the position 19B. That is, the via hole 20 ends up being larger than a desired size. Even when forming the via hole by a laser, because the same step is carried out of removing the residual resin by using the resin solvent, the same problem arises in that the obtained via hole ends up being larger than a desired size.

SUMMARY OF THE INVENTION

Accordingly, it is a general object of the present invention to solve one or more problems of the related art.

A specific object of the present invention is to provide a method of producing a multilayer interconnection board that is able to reduce residual resin at the bottom of a via hole and prevent broadening of the via hole when removing the residual resin.

According to a first aspect of the present invention, there is provided a method of producing a multilayer interconnection board, comprising the steps of forming a residual resin removing member on a via connecting portion of an interconnection layer connected with a via; forming a resin member on the interconnection layer; forming a via hole for forming said via by imprinting press on the resin member; and removing the residual resin removing member together with the residue of the resin member on the residual resin removing member.

According to the present invention, a residual resin removing member is provided on a via connecting portion of an interconnection layer connected with a via, and when forming a via hole, the residue of the resin member on the residual resin removing member is removed together with the residual resin removing member. Hence, when removing the residual resin member, the via hole does not broaden.

As an embodiment, the residual resin removing member includes a photosensitive resist.

According to the present invention, by using a developing solution that does not dissolve the resin member when dissolving the photosensitive resist, the residual resin member on the photosensitive resist is removed together with the photosensitive resist. Hence, when removing the residual resin member, the via hole does not broaden.

As an embodiment, the residual resin removing member includes a thermal setting resin member having a thermal setting temperature higher than a thermal setting temperature of the resin member.

According to the present invention, by using a thermal setting resin member having a thermal setting temperature higher than that of the resin member as the residual resin removing member, the resin member may be processed by imprinting press at a temperature lower than the temperature at which the thermal setting resin member cures completely, and an un-cured portion of the thermal setting resin member having higher solubility may be dissolved after imprinting press, hence, the residual resin member can be removed in a shorter time than in the related art.

As an embodiment, the residual resin removing member includes a resin having solubility different from solubility of the resin member.

According to the present invention, the residual resin removing member can be selectively dissolved, and this prevents the resin member from being dissolved.

According to a second aspect of the present invention, there is provided a method of producing a multilayer interconnection board, comprising the steps of forming a conductive resin on a via connecting portion of an interconnection layer connected with a via; forming a resin member on the interconnection layer; forming a via hole for forming said via by imprinting press on the resin member; and removing residue of the resin member on the conductive resin.

According to the present invention, a conductive resin is provided on a via connecting portion of an interconnection layer connected with a via, and when forming a via hole by imprinting press; the amount of the residual resin member on the conductive resin is smaller than in the related art, thus, the residual resin member can be removed in a shorter time than in the related art.

These and other objects, features, and advantages of the present invention will become more apparent from the following detailed description of the preferred embodiments given with reference to the accompanying drawings.

BRIEF DESCRIPTION OF THE DRAWINGS

FIG. 26, continuing from FIG. 25, is a cross-sectional view showing a step of the method of forming the multilayer interconnection board 60 according to the present embodiment of the present invention;

DESCRIPTION OF THE PREFERRED EMBODIMENTS

Below, preferred embodiments of the present invention are explained with reference to the accompanying drawings.

First Embodiment

Figure 1:
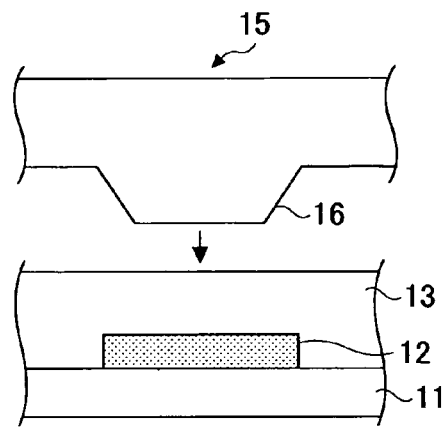
FIG. 1 is a schematic cross-sectional view showing a step of a process of forming a multilayer interconnection board in the related art.
Figure 2:
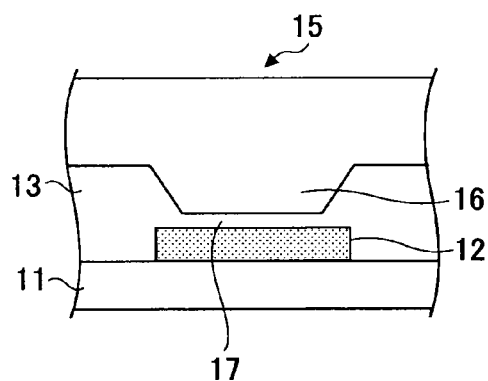
FIG. 2 is a schematic cross-sectional view showing a step of the process of forming the multilayer interconnection board in the related art.
Figure 3:
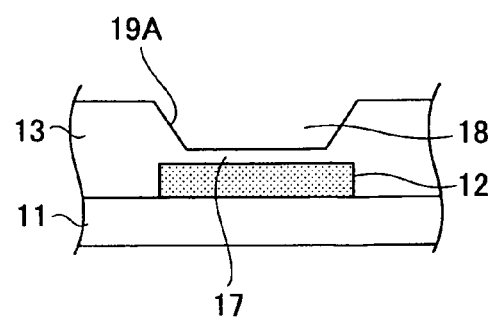
FIG. 3 is a schematic cross-sectional view showing a step of the process of forming the multilayer interconnection board in the related art.
Figure 4:
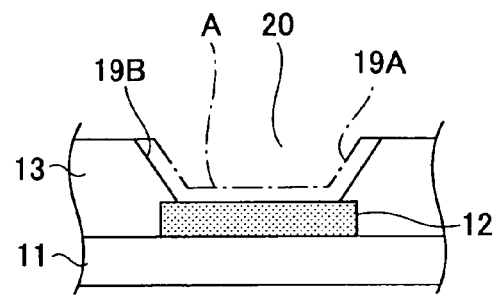
FIG. 4 is a schematic cross-sectional view showing a step of removing the residual resin layer 17 in the process of forming the multilayer interconnection board in the related art.
Figure 5:
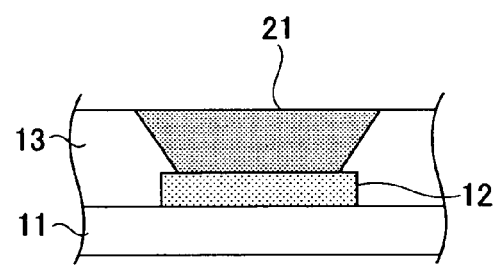
FIG. 5 is a schematic cross-sectional view showing a step in the process of forming the multilayer interconnection board in the related art.
Figure 6:
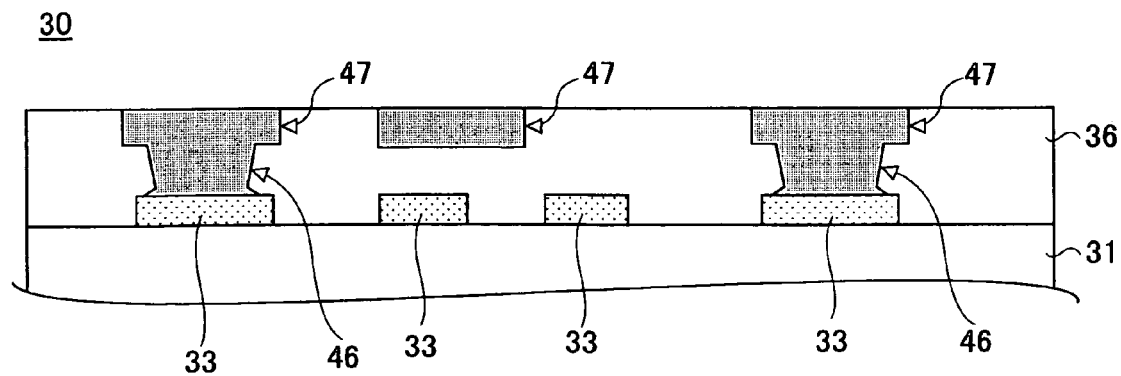
FIG. 6 is a cross-sectional view of a multilayer interconnection board 30 according to a first embodiment of the present invention.

FIG. 6 is a cross-sectional view of a multilayer interconnection board 30 according to a first embodiment of the present invention.

As illustrated in FIG. 6, the multilayer interconnection board 30 is a build-up board with multilayer interconnection structures formed on two sides of a substrate 31 (also referred to as a core substrate). The multilayer interconnection board 30 includes the substrate 31, interconnections 33, 47 formed on the surface of the substrate 31, a via 46, and resin 36.

The interconnection 33 is formed on the substrate 31. On the substrate 31 with the interconnection 33 formed thereon, the resin 36 is formed. In the resin 36, the via 46 and the interconnection 47 are formed.

The via 46 is formed on a via-connecting portion of the interconnection 33. Here, "a via-connecting portion" is a portion of the interconnection 33 to which the via 46 is connected. The via 46 is formed by filling metal into a via hole 44 (refer to FIG. 12). The via 46 is for electrically connecting the interconnection 33 with the interconnection 47.

Here, the via 46 is formed by filling metal into the via hole 44 formed in the resin 36 for electrically connecting the interconnection 33 with the interconnection 47.

Figure 12:
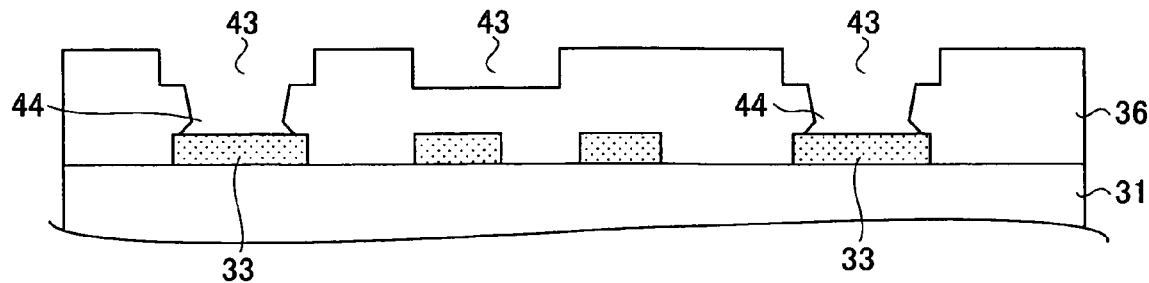
FIG. 12, continuing from FIG. 11, is a cross-sectional view showing a step of the method of forming the multilayer interconnection board 30 according to the present embodiment of the present invention.

The interconnection 47 is formed by filling metal into an interconnection groove 43 (refer to FIG. 12). The interconnection 47 has a connection portion to which the via 46 is connected. For example, a plating copper may be filled in the via hole 44 and the interconnection groove 43.

Below, descriptions are made of a method of forming the multilayer interconnection board 30 according to the first embodiment of the present invention with reference to FIG. 7 through FIG. 13.

Figure 7:
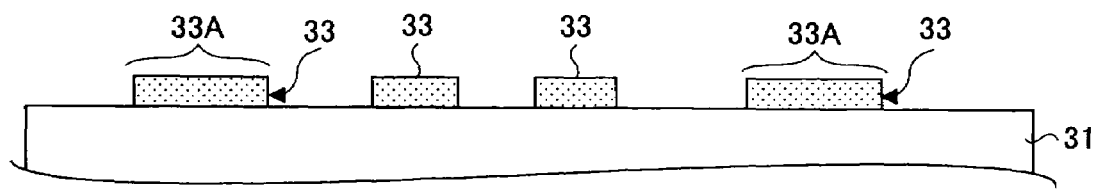
FIG. 7 is a cross-sectional view showing a step of the method of forming the multilayer interconnection board 30 according to the present embodiment of the present invention.

FIG. 7 is a cross-sectional view showing a step of the method of forming the multilayer interconnection board 30 according to the present embodiment of the present invention.

As illustrated in FIG. 7, the interconnection 33 is formed on the substrate 31. In FIG. 7, a reference number 33A indicates a via-connecting portion of the interconnection 33.

Figure 8:
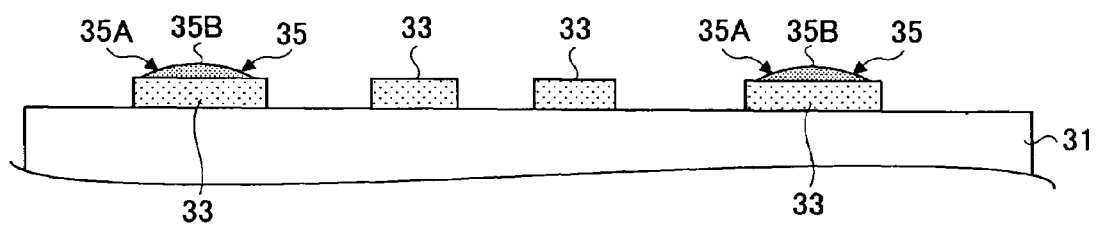
FIG. 8, continuing from FIG. 7, is a cross-sectional view showing a step of the method of forming the multilayer interconnection board 30 according to the present embodiment of the present invention.

FIG. 8, continuing from FIG. 7, is a cross-sectional view showing a step of the method of forming the multilayer interconnection board 30 according to the present embodiment of the present invention.

As illustrated in FIG. 8, a high temperature setting resin 35, which corresponds to a thermal setting resin member in the claims, is applied on the via-connecting portion 33A of the interconnection 33. The high temperature setting resin 35 cures at a temperature T1 which is higher than the thermal setting temperature T2 of a resin 36. Hence, the high temperature setting resin 35 remains un-cured at the thermal setting temperature T2 of the resin 36.

The high temperature setting resin 35 may be applied by printing or ink jetting. When the high temperature setting resin 35 is applied on the interconnection 33, the high temperature setting resin 35 has a convex upper surface due to surface tension. In FIG. 8, a reference number 35B indicates a vertex of the high temperature setting resin 35 having a convex upper surface.

The setting temperature T1 of the high temperature setting resin 35 can be adjusted by controlling additive elements in the raw materials.

Figure 9:
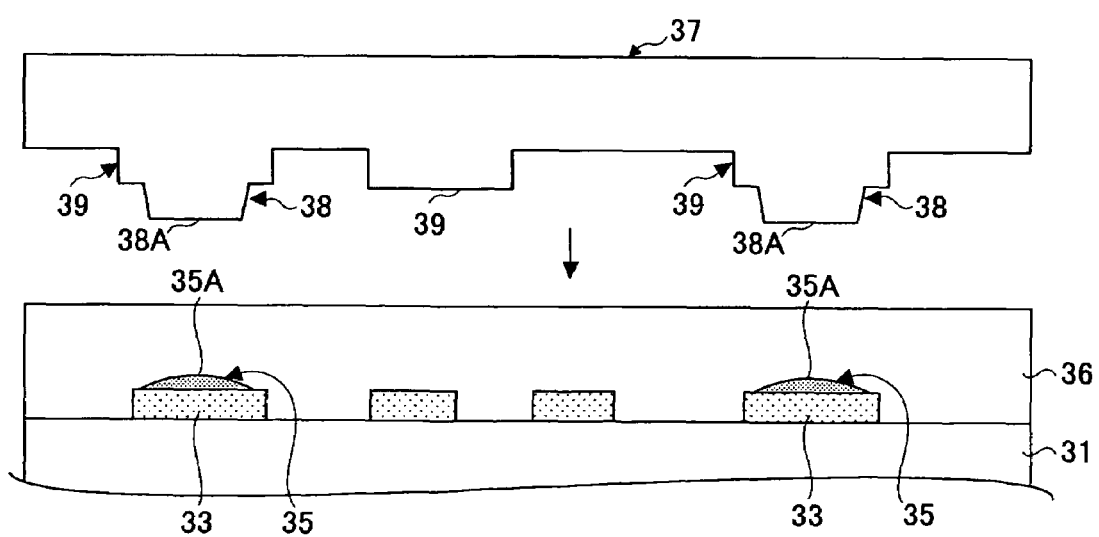
FIG. 9, continuing from FIG. 8, is a cross-sectional view showing a step of the method of forming the multilayer interconnection board 30 according to the present embodiment of the present invention.

FIG. 9, continuing from FIG. 8, is a cross-sectional view showing a step of the method of forming the multilayer interconnection board 30 according to the present embodiment of the present invention.

As illustrated in FIG. 9, a tool 37, which has a projecting portion 39 for forming an interconnection groove and a projecting portion 38 for forming a via hole, is pressed against the resin 36 to perform imprinting press while the resin 36 is heated to the temperature T2. The high temperature setting resin 35 has a convex upper surface 35A.

Figure 10:
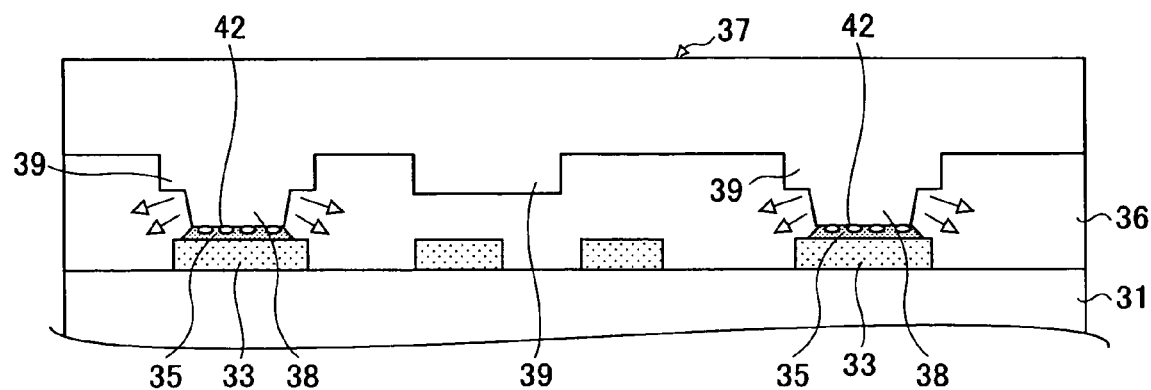
FIG. 10, continuing from FIG. 9, is a cross-sectional view showing a step of the method of forming the multilayer interconnection board 30 according to the present embodiment of the present invention.

FIG. 10, continuing from FIG. 9, is a cross-sectional view showing a step of the method of forming the multilayer interconnection board 30 according to the present embodiment of the present invention.

Because the high temperature setting resin 35 has a convex surface 35A, the surface 38A of the projecting portion 38 for forming a via hole first comes into contact with the vertex 35B of the convex surface 35A of the high temperature setting resin 35, as illustrated in FIG. 9. Subsequently, when the tool 37 is further pressed into the resin 36, as illustrated in FIG. 10, the high temperature setting resin 35 is crushed, and the surface 38A of the projecting portion 38 for forming a via hole comes into full contact with the convex surface 35A of the high temperature setting resin 35.

For this reason, before the tool 37 comes into contact with the high temperature setting resin 35, the resin 36 existing between the surface 38A of the projecting portion 38 for forming a via hole and the high temperature setting resin 35 is pressed to flow in directions indicated by arrows in FIG. 10. As a result, the resin 36 can hardly stay between the surface 38A of the projecting portion 38 for forming a via hole and the high temperature setting resin 35, and the amount of the residual resin 42 can be reduced (in other words, the residual resin 42 is thin) compared with the related art. Further, since the high temperature setting resin 35 cures at the temperature T1 higher than the thermal setting temperature T2 of the resin 36, the high temperature setting resin 35 remains un-cured at the thermal setting temperature T2 of the resin 36.

Figure 11:
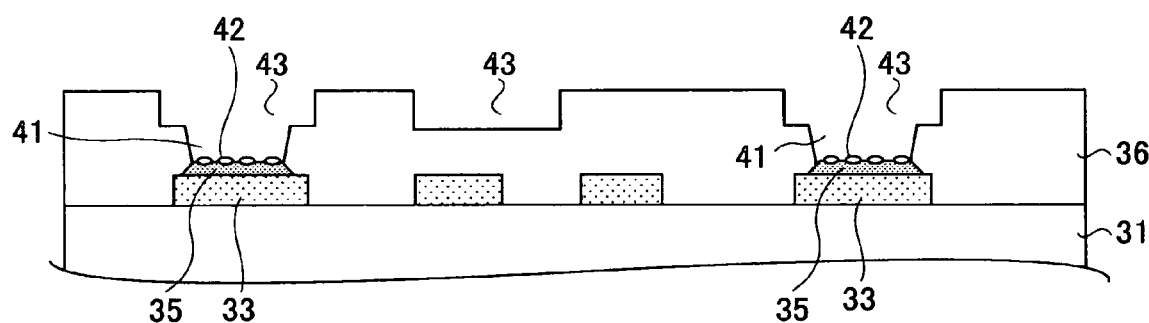
FIG. 11, continuing from FIG. 10, is a cross-sectional view showing a step of the method of forming the multilayer interconnection board 30 according to the present embodiment of the present invention.

FIG. 11, continuing from FIG. 10, is a cross-sectional view showing a step of the method of forming the multilayer interconnection board 30 according to the present embodiment of the present invention.

As illustrated in FIG. 11, the tool 37 is removed after the resin 36 cures, and thereby, forming the interconnection groove 43 for arranging the interconnection 47 and the via hole 41. Because of presence of an un-cured portion of the high temperature setting resin 35 and the residual resin 42 on the un-cured portion of the high temperature setting resin 35 between the via hole 41 and the interconnection 33, the interconnection 33 is not exposed, yet.

FIG. 12, continuing from FIG. 11, is a cross-sectional view showing a step of the method of forming the multilayer interconnection board 30 according to the present embodiment of the present invention.

As illustrated in FIG. 12, the un-cured portion of the high temperature setting resin 35 is removed by using a resin solvent. Due to this processing, the residual resin 42 on the un-cured portion of the high temperature setting resin 35 is removed together with the un-cured portion of the high temperature setting resin 35, and the interconnection 33 is exposed through the via hole 44. At this moment, because the high temperature setting resin 35 is un-cured, it can be dissolved by using the resin solvent in a short time, and thus can be easily removed.

Figure 13:
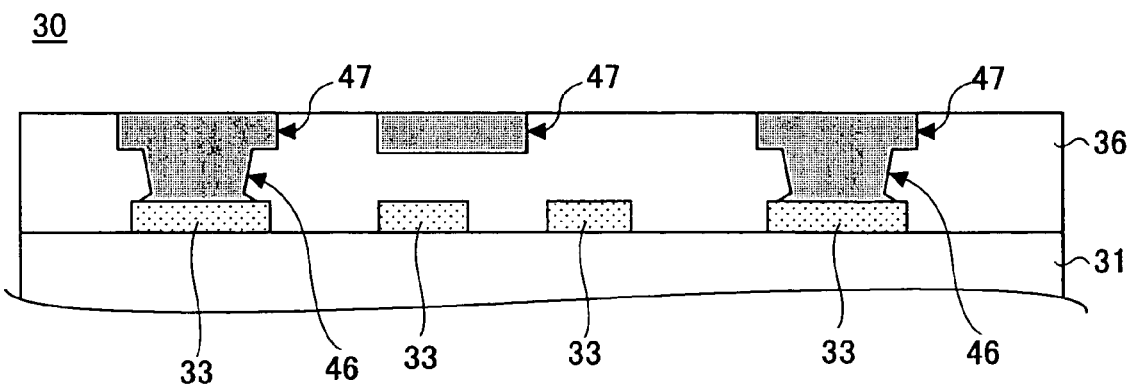
FIG. 13, continuing from FIG. 12, is a cross-sectional view showing a step of the method of forming the multilayer interconnection board 30 according to the present embodiment of the present invention.

FIG. 13, continuing from FIG. 12, is a cross-sectional view showing a step of the method of forming the multilayer interconnection board 30 according to the present embodiment of the present invention.

As illustrated in FIG. 13, the interconnection groove 43 and the via hole 44 are filled with metal and the via 46 and the interconnection 47 are formed at the same time.

According to the present embodiment, the un-cured portion of the high temperature setting resin 35 is dissolved by using the resin solvent, thus, the un-cured portion of the high temperature setting resin 35 can be dissolved in a short time, and the residual resin 42 can be removed together with the un-cured portion of the high temperature setting resin 35. As a result, the processing time by using the resin solvent can be shortened, and this reduces dissolution of the resin 36 constituting the via hole 41 and the interconnection groove 43, thereby preventing broadening of the via hole 44 and the interconnection groove 43. Further, by filling metal into the thus obtained via hole 44 and the interconnection groove 43, the via 46 and the interconnection 47 having the desired size can be obtained.

In the above, it is described that the high temperature setting resin 35 is provided only on the via-connection portion 33A of the interconnection 33, but it is certain that the high temperature setting resin 35 may also be provided on places of the interconnection 33 other than the via-connection portion 33A.

Second Embodiment

Figure 14:
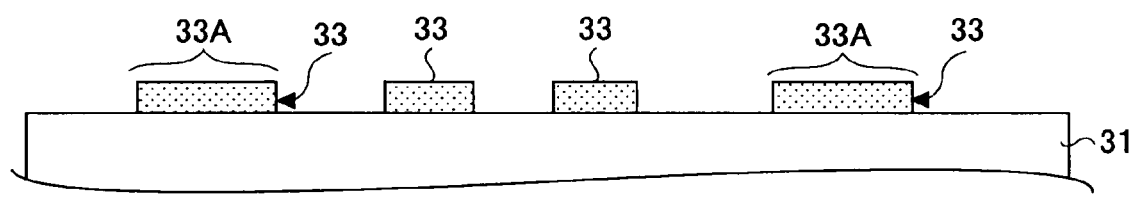
FIG. 14 is a cross-sectional view of a multilayer interconnection board 30 according to a second embodiment of the present invention.

FIG. 14 is a cross-sectional view of a multilayer interconnection board 30 according to a second embodiment of the present invention.

In FIG. 14 and the subsequent drawings, the same references are used for the same elements as those shown in the first embodiment and the overlapping descriptions are omitted.

As illustrated in FIG. 14, the interconnection 33 is formed on the substrate 31. In FIG. 14, a via-connecting portion 33A of the interconnection 33 is indicated.

Figure 15:
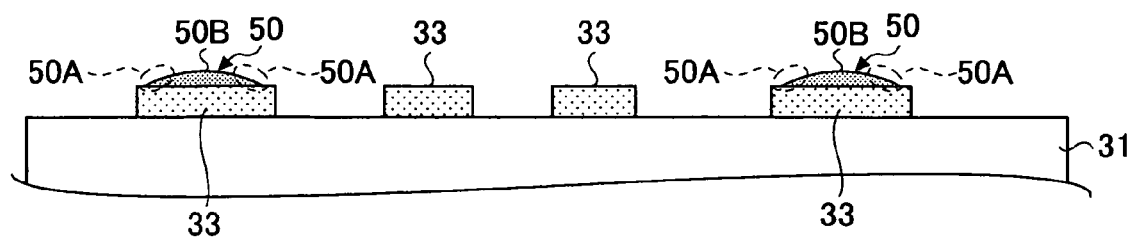
FIG. 15, continuing from FIG. 14, is a cross-sectional view showing a step of the method of forming the multilayer interconnection board 30 according to the present embodiment of the present invention.

FIG. 15, continuing from FIG. 14, is a cross-sectional view showing a step of the method of forming the multilayer interconnection board 30 according to the present embodiment of the present invention.

As illustrated in FIG. 15, a photosensitive resist 50 is deposited on the via-connecting portion 33A of the interconnection 33.

The photosensitive resist 50 may be formed by printing, ink jetting, or other well-known methods. If the photosensitive resist 50 is a positive type, the photosensitive resist 50 may be exposed to light, and if the photosensitive resist 50 is a negative type, the process proceeds up to the removing step with the photosensitive resist 50 not being exposed to light. In this process, by using a liquid-state photosensitive resist, due to surface tension, the photosensitive resist 50 has a convex upper surface.

In FIG. 15, a reference number 50B indicates a vertex of the photosensitive resist 50 having a convex upper surface.

Figure 16:
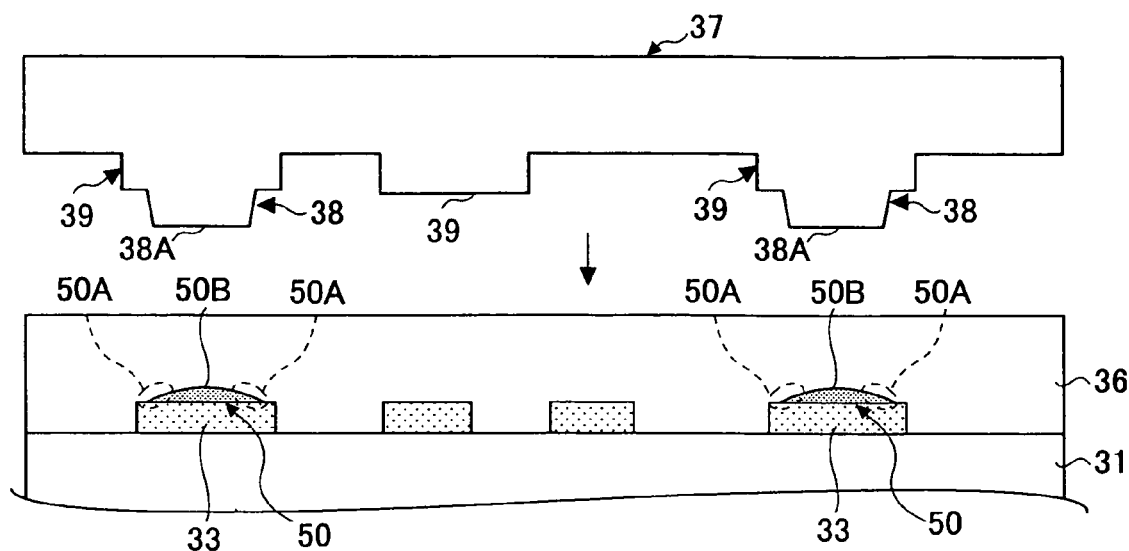
FIG. 16, continuing from FIG. 15, is a cross-sectional view showing a step of the method of forming the multilayer interconnection board 30 according to the present embodiment of the present invention.

FIG. 16, continuing from FIG. 15, is a cross-sectional view showing a step of the method of forming the multilayer interconnection board 30 according to the present embodiment of the present invention.

As illustrated in FIG. 16, a tool 37, which has a projecting portion 39 for forming an interconnection groove and a projecting portion 38 for forming a via hole, is pressed against the resin 36 to perform imprinting press while the resin 36 is heated to a temperature T2. The photosensitive resist 50 has a convex surface 50A.

Figure 17:
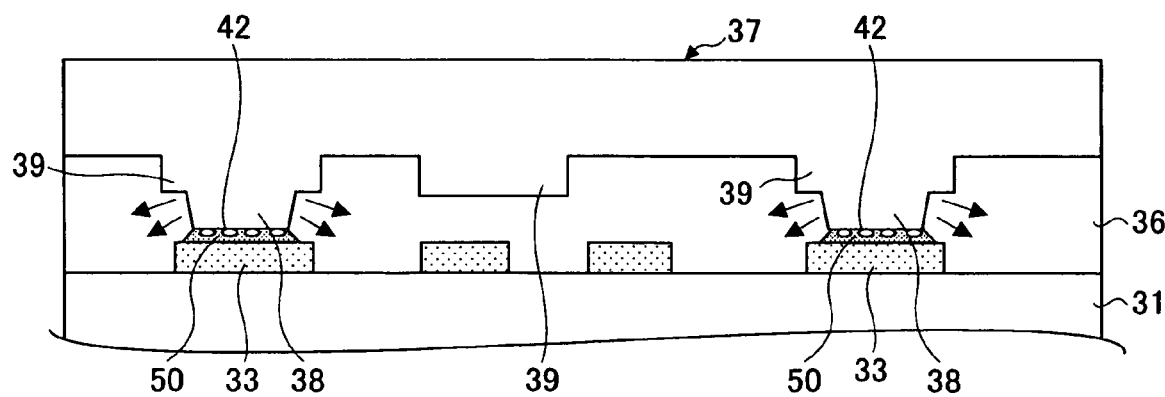
FIG. 17, continuing from FIG. 16, is a cross-sectional view showing a step of the method of forming the multilayer interconnection board 30 according to the present embodiment of the present invention.

FIG. 17, continuing from FIG. 16, is a cross-sectional view showing a step of the method of forming the multilayer interconnection board 30 according to the present embodiment of the present invention.

Because the photosensitive resist 50 has a convex surface 50A, the surface 38A of the projecting portion 38 for forming a via hole first comes into contact with the vertex 50B of the convex surface 50A of the photosensitive resist 50, as illustrated in FIG. 17. Subsequently, when the tool 37 is further pressed into the resin 36, as illustrated in FIG. 10, the photosensitive resist 50 is crushed, and the surface 38A of the projecting portion 38 for forming a via hole comes into full contact with the convex surface 50A of the photosensitive resist 50.

For this reason, before the tool 37 comes into contact with the photosensitive resist 50, the resin 36 existing between the surface 38A of the projecting portion 38 for forming a via hole and the photosensitive resist 50 is pressed to flow in directions indicated by arrows in FIG. 17. As a result, the resin 36 can hardly stay between the surface 38A of the projecting portion 38 for forming a via hole and the photosensitive resist 50, and the amount of the residual resin 42 can be reduced (in other words, the residual resin 42 is thin) compared with the related art.

Figure 18:
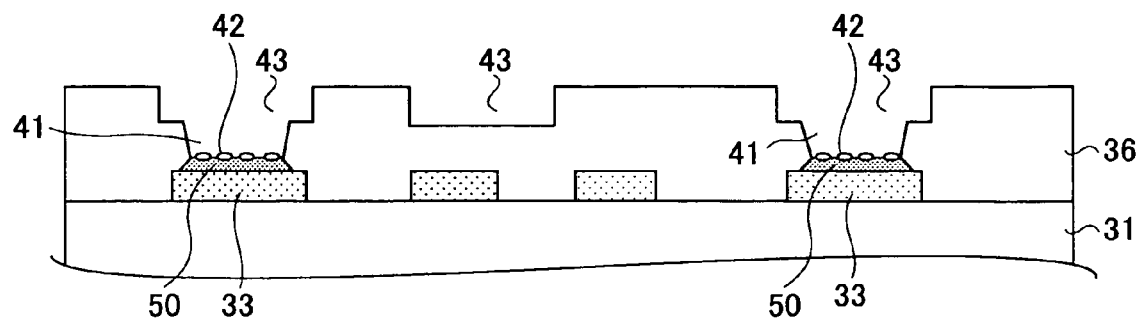
FIG. 18, continuing from FIG. 17, is a cross-sectional view showing a step of the method of forming the multilayer interconnection board 30 according to the present embodiment of the present invention.

FIG. 18, continuing from FIG. 17, is a cross-sectional view showing a step of the method of forming the multilayer interconnection board 30 according to the present embodiment of the present invention.

As illustrated in FIG. 18, the tool 37 is removed after the resin 36 cures, and thereby, forming the interconnection groove 43 for arranging the interconnection 47 and the via hole 41. Because of presence of the residual resin 42 on the photosensitive resist 50 between the via hole 41 and the interconnection 33, the interconnection 33 is not exposed, yet.

Figure 19:
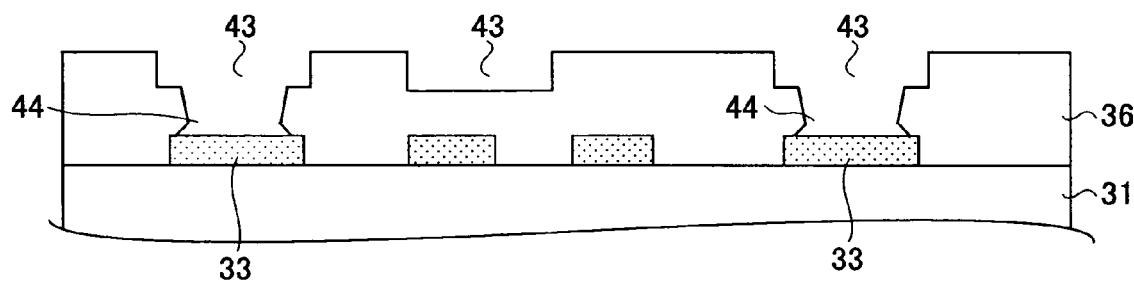
FIG. 19, continuing from FIG. 18, is a cross-sectional view showing a step of the method of forming the multilayer interconnection board 30 according to the present embodiment of the present invention.

FIG. 19, continuing from FIG. 18, is a cross-sectional view showing a step of the method of forming the multilayer interconnection board 30 according to the present embodiment of the present invention.

Next, the photosensitive resist 50 is immersed into a developing solution, thereby, as illustrated in FIG. 19, the residual resin 42 on the photosensitive resist 50 is removed together with the photosensitive resist 50, and the interconnection 33 is exposed through the via hole 44. In this step, the developing solution is selected to only dissolve the photosensitive resist 50 but not dissolve the resin 36 which constitutes the interconnection groove 43 and the via hole 41. Hence, after removing the residual resin 42, the via hole 44 and the interconnection groove 43 do not broaden.

Figure 20:
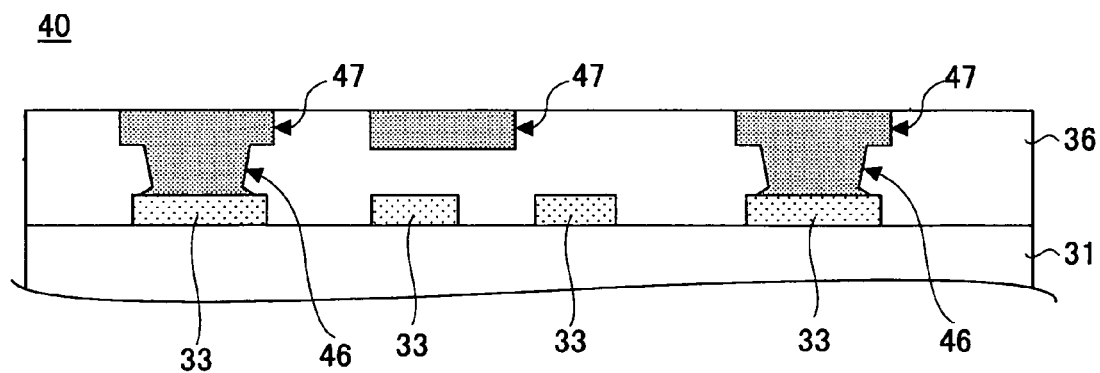
FIG. 20, continuing from FIG. 19, is a cross-sectional view showing a step of the method of forming the multilayer interconnection board 30 according to the present embodiment of the present invention.

FIG. 20, continuing from FIG. 19, is a cross-sectional view showing a step of the method of forming the multilayer interconnection board 30 according to the present embodiment of the present invention.

As illustrated in FIG. 20, the interconnection groove 43 and the via hole 44 are filled with metal and the via 46 and the interconnection 47 are formed at the same time.

According to the present embodiment, the amount of the residual resin 42 on the photosensitive resist 50 is reduced, and the residual resin 42 is removed together with the photosensitive resist 50 by using the developing solution. As a result, this prevents dissolution of the resin 36 constituting the via hole 41 and the interconnection groove 43 when removing the residual resin 42, thereby preventing broadening of the via hole 44 and the interconnection groove 43, and enabling precise formation of the via hole 44 and the interconnection groove 43. Further, by filling metal into the thus obtained via hole 44 and the interconnection groove 43, the via 52 and the interconnection 47 having the desired size can be obtained.

Third Embodiment

Figure 21:
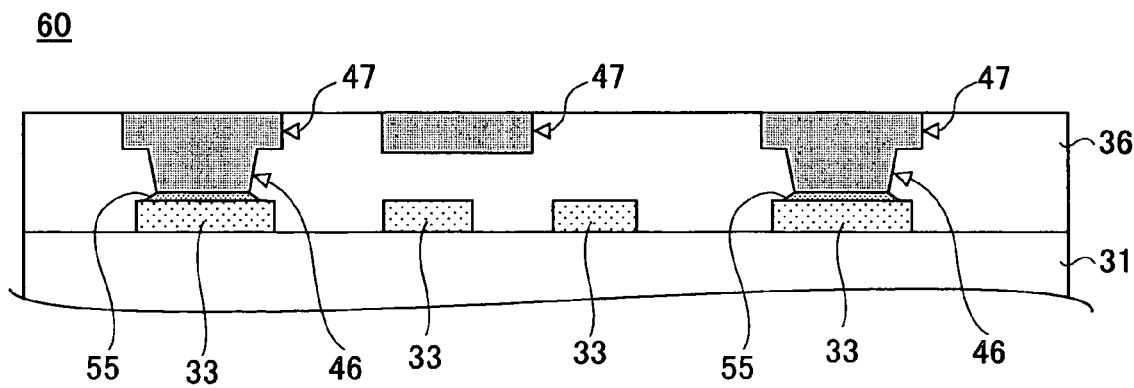
FIG. 21 is a cross-sectional view of a multilayer interconnection board 60 according to a third embodiment of the present invention.

FIG. 21 is a cross-sectional view of a multilayer interconnection board 60 according to a third embodiment of the present invention.

In FIG. 21 and the subsequent drawings, the same references are used for the same elements as those shown in the previous embodiments and the overlapping descriptions are omitted.

As illustrated in FIG. 21, the multilayer interconnection board 60 is a built-up board with multilayer interconnection structures formed on two sides of a substrate 31. The multilayer interconnection board 60 is characterized in that a conductive resin 55 is interposed between the interconnections 33 and a via 52.

Specifically, the multilayer interconnection board 60 includes the substrate 31, interconnections 33, 47 formed on the substrate 31, a via 52, resin 36, and conductive resin 55.

The interconnection 33 is formed on the substrate 31. The conductive resin 55 is formed in the via-connecting portion 33A of the interconnection 33 (refer to FIG. 22). The conductive resin 55 is for electrically connecting the interconnection 33 and the via 52. Due to a surface tension, the conductive resin 55 has a convex upper surface. For example, the conductive resin 55 may be formed from a silver paste.

The resin 36 is formed on the substrate 31 with the interconnection 33 and the conductive resin 55 formed thereon. In the resin 36, the via 52 and the interconnection 47 are formed.

Figure 27:
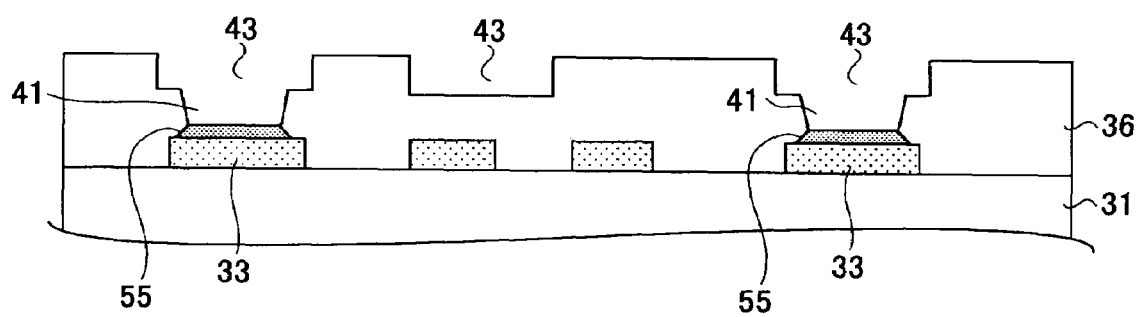
FIG. 27, continuing from FIG. 26, is a cross-sectional view showing a step of the method of forming the multilayer interconnection board 60 according to the present embodiment of the present invention.
Figure 28:
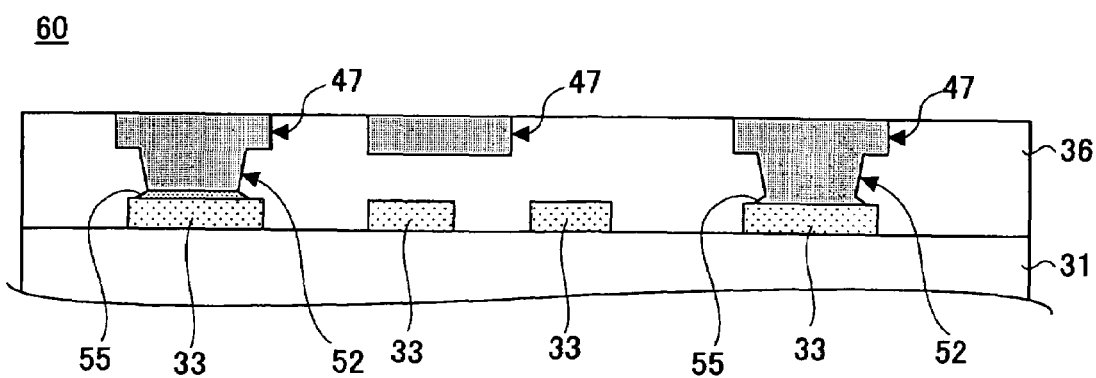
FIG. 28, continuing from FIG. 27, is a cross-sectional view showing a step of the method of forming the multilayer interconnection board 60 according to the present embodiment of the present invention.

The via 52 is formed by filling metal into a via hole 41 (refer to FIG. 27, FIG. 28). The via 52 is for electrically connecting the conductive resin 55 with the interconnection 47. The interconnection 47 is formed on the via 52, by filling metal into an interconnection groove 43 (refer to FIG. 27, FIG. 28).

Below, descriptions are made of a method of forming the multilayer interconnection board 60 according to the third embodiment of the present invention with reference to FIG. 22 through FIG. 28.

Figure 22:
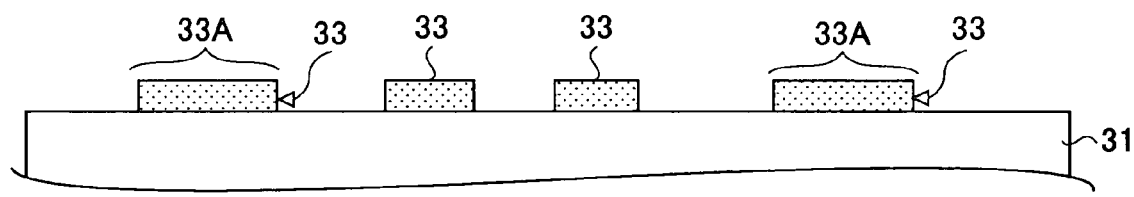
FIG. 22 is a cross-sectional view showing a step of the method of forming the multilayer interconnection board 60 according to the present embodiment of the present invention.

FIG. 22 is a cross-sectional view showing a step of the method of forming the multilayer interconnection board 60 according to the present embodiment of the present invention.

As illustrated in FIG. 22, the interconnection 33 is formed on the substrate 31. In FIG. 22, a via-connecting portion 33A of the interconnection 33 is indicated.

Figure 23:
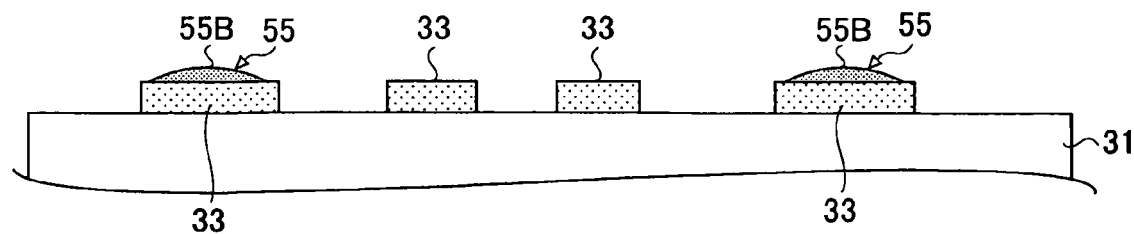
FIG. 23, continuing from FIG. 22, is a cross-sectional view showing a step of the method of forming the multilayer interconnection board 60 according to the present embodiment of the present invention.

FIG. 23, continuing from FIG. 22, is a cross-sectional view showing a step of the method of forming the multilayer interconnection board 60 according to the present embodiment of the present invention.

As illustrated in FIG. 23, conductive resin 55 is deposited on the via-connecting portion 33A of the interconnection 33. Due to surface tension, the photosensitive resist 50 has a convex upper surface. For example, the conductive resin 55 may be formed from a silver paste.

Figure 24:
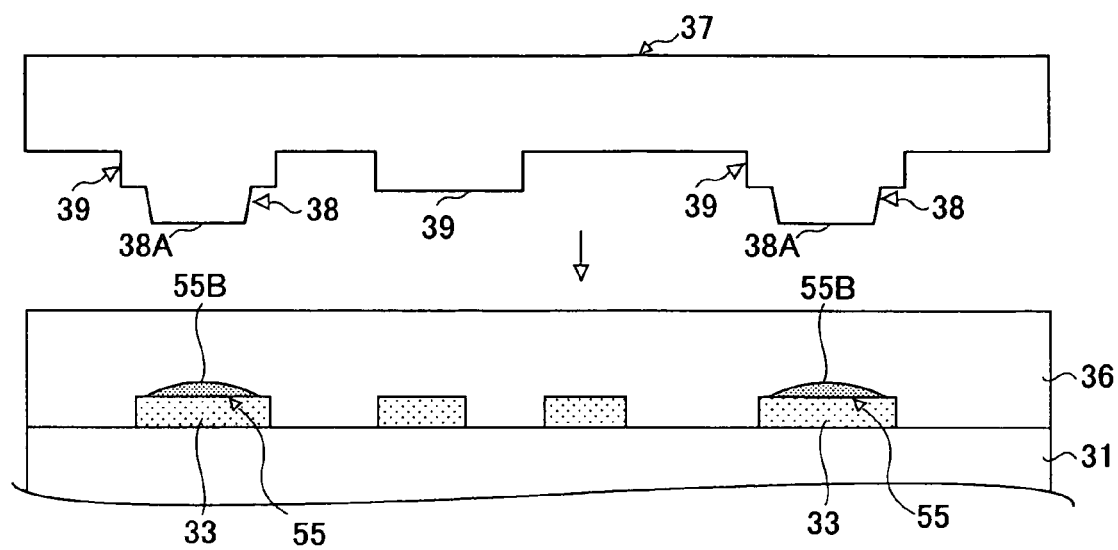
FIG. 24, continuing from FIG. 23, is a cross-sectional view showing a step of the method of forming the multilayer interconnection board 60 according to the present embodiment of the present invention.

FIG. 24, continuing from FIG. 23, is a cross-sectional view showing a step of the method of forming the multilayer interconnection board 60 according to the present embodiment of the present invention.

As illustrated in FIG. 24, a tool 37, which has a projecting portion 39 for forming an interconnection groove and a projecting portion 38 for forming a via hole, is pressed against the resin 36 to perform imprinting press while the resin 36 is heated to a temperature T2.

Figure 25:
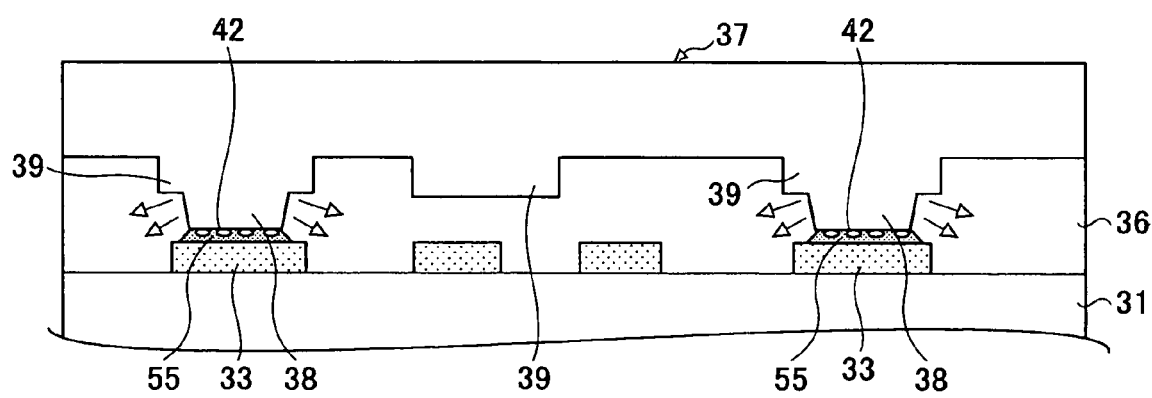
FIG. 25, continuing from FIG. 24, is a cross-sectional view showing a step of the method of forming the multilayer interconnection board 60 according to the present embodiment of the present invention.

FIG. 25, continuing from FIG. 24, is a cross-sectional view showing a step of the method of forming the multilayer interconnection board 60 according to the present embodiment of the present invention.

Because the conductive resin 55 has a convex upper surface, the surface 38A of the projecting portion 38 for forming a via hole first comes into contact with a vertex 55B of the convex surface of the conductive resin 55, as illustrated in FIG. 24. Subsequently, when the tool 37 is further pressed into the resin 36, as illustrated in FIG. 25, the conductive resin 55 is crushed, and the surface 38A of the projecting portion 38 for forming a via hole comes into full contact with the convex surface of the conductive resin 55.

For this reason, before the tool 37 comes into contact with the conductive resin 55, the resin 36 existing between the surface 38A of the projecting portion 38 for forming a via hole and the conductive resin 55 is pressed to flow in directions indicated by arrows in FIG. 25. As a result, the resin 36 can hardly stay between the surface 38A of the projecting portion 38 for forming a via hole and the conductive resin 55, and the amount of the residual resin 42 can be reduced (in other words, the residual resin 42 is thin) compared with the related art.

FIG. 26, continuing from FIG. 25, is a cross-sectional view showing a step of the method of forming the multilayer interconnection board 60 according to the present embodiment of the present invention.

As illustrated in FIG. 26, the tool 37 is removed after the resin 36 cures, and thereby, forming the interconnection groove 43 for arranging the interconnection 47 and the via hole 41 for arranging the via 52.

FIG. 27, continuing from FIG. 26, is a cross-sectional view showing a step of the method of forming the multilayer interconnection board 60 according to the present embodiment of the present invention.

As illustrated in FIG. 27, by using a resin solvent, a residual resin 42 is dissolved and is removed.

FIG. 28, continuing from FIG. 27, is a cross-sectional view showing a step of the method of forming the multilayer interconnection board 60 according to the present embodiment of the present invention.

As illustrated in FIG. 28, the interconnection groove 43 and the via hole 41 are filled with metal and the via 52 and the interconnection 47 are formed at the same time.

According to the present embodiment, the amount of the residual resin 42 on the conductive resin 55 is reduced, and thus, the residual resin 42 can be dissolved by using the resin solvent in a short time. As a result, the processing time by using the resin solvent is shortened, and this reduces dissolution of the resin 36 constituting the via hole 41 and the interconnection groove 43, thereby preventing broadening of the via hole 41 and the interconnection groove 43. Further, by filling metal into the thus obtained via hole 41 and the interconnection groove 43, the via 52 and the interconnection 47 having the desired size can be obtained.

In the above, it is described that the conductive resin 55 is provided only on the via-connection portion 33A of the interconnection 33, but it is certain that the conductive resin 55 may also be provided on places of the interconnection 33 other than the via-connection portion 33A.

While the present invention has been described with reference to specific embodiments chosen for purpose of illustration, it should be apparent that the invention is not limited to these embodiments, but numerous modifications could be made thereto by those skilled in the art without departing from the basic concept and scope of the invention.

According to the present invention, it is possible to provide a method of producing a multilayer interconnection board that is able to reduce residual resin at the bottom of a via hole, and prevent broadening of the via hole when removing the residual resin.

This patent application is based on Japanese Priority Patent Application No. 2004-008796 filed on Jan. 16, 2004, the entire contents of which are hereby incorporated by reference.

What is claimed is:

1. A method of producing a multilayer interconnection board, comprising the steps of:
   forming a residual resin removing member on a via connecting portion of an interconnection layer connected with a via;
   forming a resin member on the interconnection layer and on the residual resin removing member;
   forming a via hole for forming said via by imprinting press on the resin member;
   exposing the residual resin removing member;
   removing the residual resin removing member together with a residue of the resin member on the residual resin removing member; and
   filling the via hole with metal to form the multilayer interconnection.

2. The method as claimed in claim 1, wherein the residual resin removing member includes a photosensitive resist.

3. The method as claimed in claim 1, wherein the residual resin removing member includes a thermal selling resin member having a thermal selling temperature higher than a thermal setting temperature of the resin member.

4. The method as claimed in claim 1, wherein the residual resin removing member includes a resin having solubility different from solubility of the resin member.

5. A method of producing a multilayer interconnection board, comprising the steps of:
   forming a conductive resin on a via connecting portion of an interconnection layer connected with a via;
   forming a resin member on the interconnection layer and on the conductive resin;
   forming a via hole for forming said via by imprinting press on the resin member;
   exposing the conductive resin;
   removing a residue of the resin member on the conductive resin; and
   filling the via holes with metal to form the multilayer interconnection.

* * * * *